(12) United States Patent
Natori et al.

(10) Patent No.: US 7,405,133 B2
(45) Date of Patent: Jul. 29, 2008

(54) SEMICONDUCTOR DEVICE AND METHOD FOR MANUFACTURING THE SAME

(75) Inventors: Katsuaki Natori, Yokohama (JP);
Tomohiro Saito, Yokohama (JP);
Yoshihiro Uozumi, Yokohama (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 108 days.

(21) Appl. No.: 11/256,929

(22) Filed: Oct. 25, 2005

(65) Prior Publication Data

US 2006/0038215 A1    Feb. 23, 2006

Related U.S. Application Data

(62) Division of application No. 10/222,813, filed on Aug. 19, 2002, now Pat. No. 7,022,580, which is a division of application No. 09/609,712, filed on Jun. 30, 2000, now Pat. No. 6,459,111.

(30) Foreign Application Priority Data

Jun. 30, 1999    (JP)    ................. 11-187018

(51) Int. Cl.
*H01L 21/20* (2006.01)
(52) U.S. Cl. ............... 438/397; 438/244; 257/E21.208
(58) Field of Classification Search ............. 438/244, 438/397; 257/E21.208
See application file for complete search history.

(56) References Cited

U.S. PATENT DOCUMENTS

| 5,198,384 A | 3/1993 | Dennison |
| 5,330,931 A | 7/1994 | Emesh et al. |
| 5,397,908 A | 3/1995 | Dennison et al. |
| 5,416,042 A | 5/1995 | Beach et al. |
| 5,442,585 A | 8/1995 | Eguchi et al. |
| 5,693,553 A | 12/1997 | Kashihara et al. |
| 5,717,236 A | 2/1998 | Shinkawata |
| 5,789,303 A | 8/1998 | Leung et al. |
| 5,828,092 A | 10/1998 | Tempel |
| 6,051,859 A | 4/2000 | Hosotani et al. |

(Continued)

FOREIGN PATENT DOCUMENTS

DE    44 02 216 A1    7/1994

(Continued)

OTHER PUBLICATIONS

Notification of Reasons for Rejection, mailed Oct. 5, 2004, by the Japanese Patent Office, for Japanese Application No. 11-187018, and English-language translation thereof.

(Continued)

*Primary Examiner*—Walter L. Lindsay, Jr.
*Assistant Examiner*—Grant S Withers
(74) *Attorney, Agent, or Firm*—Finnegan, Henderson, Farabow, Garrett & Dunner, L.L.P.

(57) ABSTRACT

A semiconductor device comprising a semiconductor substrate, and a plurality of capacitors formed on the semiconductor substrate. The capacitors comprise a plurality of lower electrodes formed on the semiconductor substrate, a ferroelectric film formed continuously covering the plurality of lower electrodes, and an upper electrode formed on the surface of the ferroelectric film, wherein each of the capacitors is formed for each of the plurality of lower electrode.

5 Claims, 13 Drawing Sheets

U.S. PATENT DOCUMENTS 6,204,172 B1 3/2001 Marsh
6,211,542 B1 4/2001 Eastep et al.
6,303,958 B1 10/2001 Kanaya et al.

FOREIGN PATENT DOCUMENTS

| | | |
|---|---|---|
| EP | 448307 A | 9/1991 |
| JP | 7-115140 | 5/1995 |
| JP | 8-83894 | 3/1996 |
| JP | 8-264719 | 10/1996 |
| JP | 8-316430 | 11/1996 |
| JP | 9-135007 | 5/1997 |
| JP | 9-162311 | 6/1997 |
| JP | 9-162369 | 6/1997 |
| JP | 10-79478 | 3/1998 |
| JP | 10-209391 | 8/1998 |
| JP | 10-340871 | 12/1998 |
| JP | 11-31682 | 2/1999 |
| JP | 11-40768 | 2/1999 |
| JP | 2000-31396 | 1/2000 |
| JP | 2000-260956 | 9/2000 |
| KR | 1999-013932 | 2/1999 |

OTHER PUBLICATIONS

Decision of Rejection issued by Japanese Patent Office, mailed Feb. 1, 2005, in Japanese application No. 11-187018, and English translation of Notice.

Notification of Reasons for Rejection mailed by the Japanese Patent Office on Jul. 26, 2005 in counterpart Japanese Application No. 11-187018.

German Patent Office Action mailed by the German Patent Office on Aug. 4, 2005 in counterpart German Application No. 100 31 881.9-33.

German Patent Office Action mailed by the German Patent Office on Aug. 4, 2005 in counterpart German Application No. 100 66 244.7-33.

German Patent Office Action mailed by the German Patent Office on Jun. 26, 2007 in counterpart German Application No. 100 66 334.6-33.

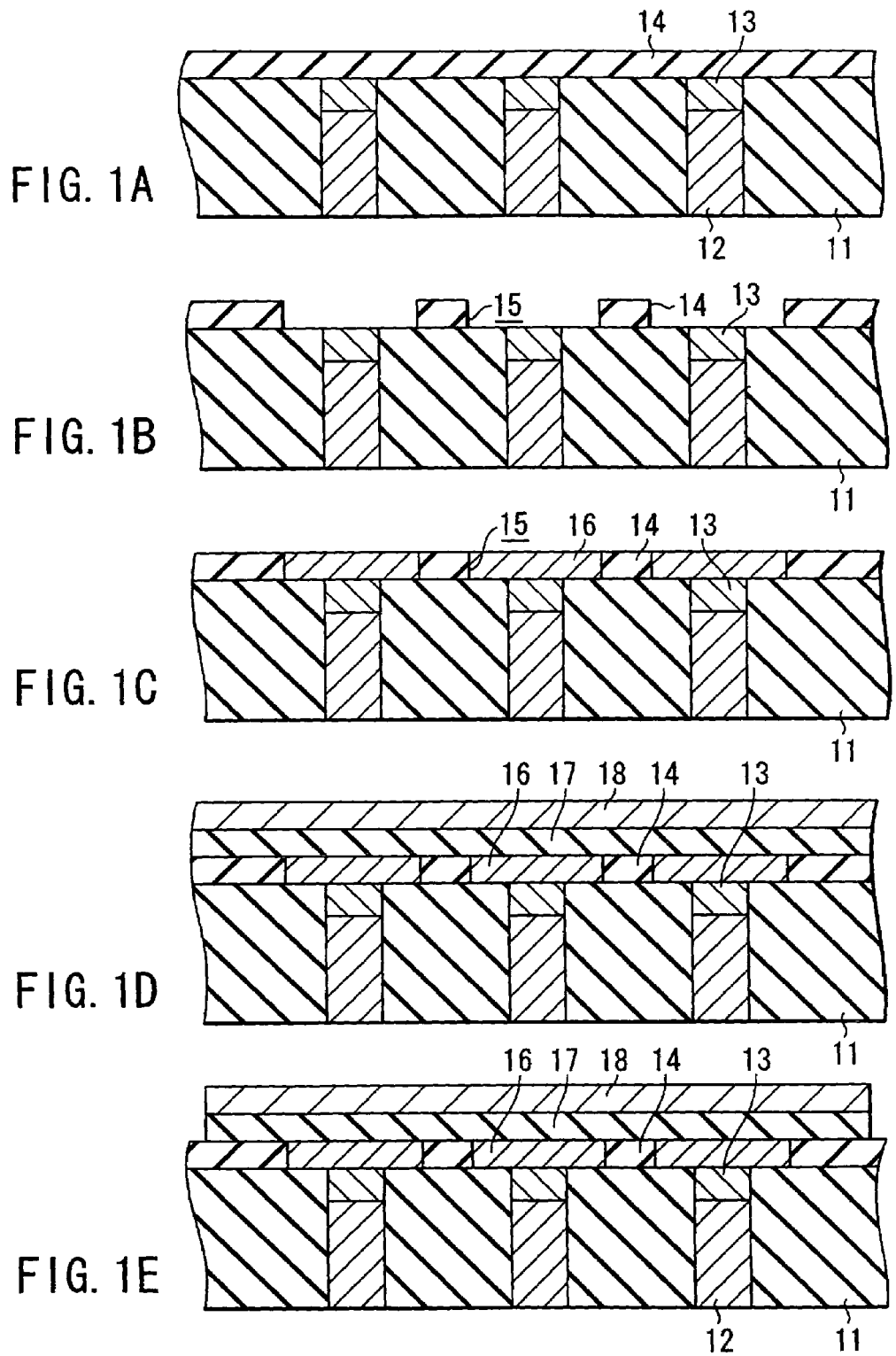

US 7,405,133 B2

SEMICONDUCTOR DEVICE AND METHOD FOR MANUFACTURING THE SAME

CROSS-REFERENCE TO RELATED APPLICATIONS

This is a division of application Ser. No. 10/222,813, filed Aug. 19, 2002, now U.S. Pat. No. 7,022,580 which is a division of Ser. No. 09/609,712, filed Jun. 30, 2000 (now U.S. Pat. No. 6,459,111) which are incorporated in their entirety herein by reference. This application is also based upon and claims priority from Japanese Patent Application No. 11-187018, filed Jun. 30, 1999, the entire contents of which are incorporated herein by reference.

BACKGROUND OF THE INVENTION

This invention relates to a semiconductor device provided with a capacitor wherein a ferroelectric film is employed as a dielectric film, and to a method for manufacturing such a semiconductor device.

A ferroelectric RAM provided with a capacitor wherein a ferroelectric film is employed as a capacitor dielectric film has been attracting attention as a high-speed readable and writable RAM.

In a process of forming a capacitor of a ferroelectric RAM, a step of patterning a ferroelectric film constituting a capacitor dielectric film is required. Conventionally, the patterning of a ferroelectric film of such as $Pb(Zr, Ti)O_3$ is usually performed by means of plasma dry etching where Ar and $Cl_2$ are employed as an etching gas.

However, when the patterning of a ferroelectric film is performed by means of the dry etching of this kind, the ferroelectric film is inevitably exposed to plasma, thereby raising various problems that the ferroelectric film may be damaged or the dielectric property of the ferroelectric film may be deteriorated, thus resulting in a decrease of the number of repetition of writing in the ferroelectric RAM.

BRIEF SUMMARY OF THE INVENTION

Therefore, an object of this invention is to provide a semiconductor device provided with a capacitor wherein a ferroelectric film is employed as a dielectric film, and the ferroelectric film is prevented from being deteriorated.

Another object of this invention is to provide a method of manufacturing a semiconductor device provided with a capacitor with a ferroelectric film being employed as a dielectric film, wherein in the step of working the ferroelectric film, the ferroelectric film is prevented from being damaged and the dielectric property of the ferroelectric film is inhibited from being deteriorated.

According to this invention, there is provided a semiconductor device comprising a semiconductor substrate, and a plurality of capacitors formed on the semiconductor substrate, wherein the plurality of capacitors comprise a plurality of lower electrodes formed on the semiconductor substrate, a ferroelectric film formed continuously covering the plurality of lower electrodes, and an upper electrode formed on the surface of the ferroelectric film, each of the plurality of capacitors being formed for each of the plurality of lower electrodes.

Further, according to this invention, there is also provided a semiconductor device comprising a semiconductor substrate, an insulating film having a hole and formed on the semiconductor substrate, and a capacitor formed on the insulating film, wherein the capacitor comprises a lower electrode formed on a bottom portion of the hole of the insulating film, a ferroelectric film filled in the hole, and an upper electrode formed on the surface of the ferroelectric film.

Further, according to this invention, there is also provided a method of manufacturing a semiconductor device, which comprises the steps of:

forming an interlayer insulating film on a semiconductor substrate;

forming an insulating layer on the interlayer insulating film;

forming a plurality of holes in the insulating film;

filling a lower electrode in each of the holes to form a plurality of lower electrodes;

forming a ferroelectric film on the insulating layer as well as on the plurality of lower electrodes;

forming a conductive layer on the ferroelectric film; and patterning the conductive layer and the ferroelectric film to form a capacitor dielectric film and an upper electrode covering the plurality of lower electrodes, thereby forming a capacitor for each of the plurality of lower electrodes.

Further, according to this invention, there is also provided a method of manufacturing a semiconductor device, which comprises the steps of:

forming a first insulating film on a semiconductor substrate;

forming a first conductive layer and a dummy film successively on the first insulating film;

forming a dummy film pattern by patterning the dummy film;

forming a lower electrode by etching the first conductive layer with the dummy film pattern being employed as a mask;

forming a second insulating film on the first insulating film as well as on the dummy film;

removing a surface region of the second insulating film to expose a surface of the dummy film pattern;

forming a first hole having a bottom exposing the lower electrode by removing the dummy film pattern;

forming a ferroelectric film filling the first hole; and forming an upper electrode on the ferroelectric film thereby forming a capacitor.

Furthermore, according to this invention, there is also provided a method of manufacturing a semiconductor device, which comprises the steps of:

forming an insulating film on a semiconductor substrate;

forming a first hole in the insulating film;

forming a conductive layer on the insulating layer as well as on an inner wall of the first hole;

forming a dummy film filling the first hole having the conductive layer deposited on the inner wall;

removing an exposed portion of the conductive layer thereby forming a lower electrode consisting essentially of the portion of the conductive layer that remains on a bottom of the first hole;

removing the dummy film to expose the lower electrode, thereby forming a second hole having a sidewall exposing the insulating film and a bottom exposing the lower electrode;

forming a ferroelectric film filling the second hole; and forming an upper electrode on the ferroelectric film thereby forming a capacitor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1E illustrate respectively a cross-sectional view illustrating the manufacturing steps of a semiconductor device according to a first example of this invention;

DETAILED DESCRIPTION OF THE INVENTION

Figure 2A:
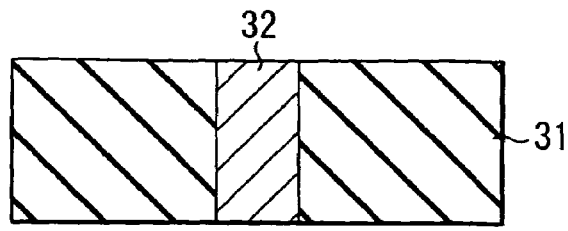
FIGS. 2A to 2J illustrate respectively a cross-sectional view illustrating the manufacturing steps of a semiconductor device according to a second example of this invention.

The semiconductor device according to a first embodiment of this invention is featured in that it comprises a plurality of lower electrodes formed on a semiconductor substrate, a ferroelectric film formed continuously covering the plurality of lower electrodes, and an upper electrode formed on the surface of the ferroelectric film, wherein each of the capacitors is formed for each of the plurality of lower electrodes.

In this case, the number of lower electrodes relative, i.e. the number of capacitor to each ferroelectric film and upper electrode should preferably be in the range of from 2 to 32, more preferably in the range of 8 to 32.

As mentioned above, since these ferroelectric film and upper electrode are formed continuously covering a plurality of lower electrodes, the patterning of these upper electrode and ferroelectric film can be performed at a region which has nothing to do with the property of capacitor, thereby making it possible to prevent the dielectric property of the ferroelectric film from being deteriorated at a region giving an influence to the capacitor.

The semiconductor device according to a second embodiment of this invention is featured in that a capacitor is constituted by a lower electrode formed on a bottom portion of the hole of the insulating film formed on a semiconductor substrate, a ferroelectric film filled in this hole, and an upper electrode formed on the surface of the ferroelectric film.

In the semiconductor device of the second embodiment of this invention, the ferroelectric film can be formed to have an area which is smaller than that of the lower electrode and of the upper electrode.

It is also possible in this second embodiment of this invention to construct the lower electrode, the ferroelectric film and the upper electrode so as to respectively have an area which increases in the mentioned order.

It is also possible in this second embodiment of this invention to construct the ferroelectric film so as to be buried in the hole and to extend over the insulating film.

In the same way as in the aforementioned first embodiment of the semiconductor device, the semiconductor device according to this second embodiment of this invention can be constructed such that the ferroelectric film and the upper electrode are formed continuously covering a plurality of lower electrodes, and that a capacitor is formed for every lower electrodes. However, it is also possible, as in the case of the ordinary capacitor, to form an individual ferroelectric film and an individual upper electrode in conformity with each of the lower electrodes, thereby producing a capacitor.

As described above, according to this second embodiment of semiconductor device of this invention, since the formation and patterning of the upper electrode are performed while the ferroelectric film is buried in the hole, the ferroelectric film can be prevented from being exposed to a plasma atmosphere, and hence, the ferroelectric film can be prevented from being damaged, thereby making it possible to prevent the properties of the ferroelectric film from being badly affected.

Further, since the ferroelectric film is formed to have a smaller area than that of the lower electrode and of the upper electrode, or since the lower electrode, the ferroelectric film and the upper electrode are constructed so as to respectively have an area which increases in the mentioned order, the distance between the upper electrode and the lower electrode can be increased, and the generation of leak current from the periphery of the ferroelectric film can be inhibited, thereby making it possible to improve the dielectric property of the ferroelectric film.

By the way, the insulating film may be either a single layer structure or a multi-layer structure.

Next, various preferable examples according to this invention will now be described with reference to drawings.

EXAMPLE 1

FIGS. 1A to 1E illustrate respectively a cross-sectional view illustrating the manufacturing steps of a semiconductor device according to a first example of this invention.

First of all, as shown in FIG. 1A, an upper portion of a W-plug 12 formed in an interlayer insulating film 11 is selectively etched, and then, a TiN film is deposited all over the top surface. Thereafter, by means of CMP (chemical mechanical polishing), the TiN film which is deposited on the interlayer insulating film 11 is removed to leave a TiN barrier layer 13 on the W-plug 12. Then, a $TiO_2$ film 14 to be employed as an insulating layer for insulating neighboring lower electrodes from each other is deposited all over the top surface to a thickness of 50 nm.

Next, as shown in FIG. 1B, after a resist pattern (not shown) corresponding to a lower electrode pattern is formed, the $TiO_2$ film 14 is subjected to RIE thereby to form a hole 15 in the $TiO_2$ film 14, the resist pattern being subsequently removed.

Then, as shown in FIG. 1C, after an $SrRuO_3$ film is deposited to a thickness of 70 nm by means of sputtering method, the SrRuO$_3$ film is polished by means of CMP with the TiO$_2$ film 14 being employed as a stopper, thereby removing a superfluous portion of the SrRuO$_3$ film that existed on the TiO$_2$ film 14, thus forming a plurality of lower electrodes 16 consisting of the SrRuO$_3$ film which is left remained in the hole 15.

Thereafter, as shown in FIG. 1D, a Pb(Zr, Ti)O$_3$ film 17 having a thickness of 100 nm and another SrRuO$_3$ film 18 to be employed as an upper electrode and having a thickness of 100 nm are successively deposited.

Subsequently, as shown in FIG. 1E, for the purpose of forming a ferroelectric film and an upper electrode in conformity with a region including the aforementioned plurality of lower electrodes 16, the patternings of the SrRuO$_3$ film 18 and the Pb(Zr, Ti)O$_3$ film 17 are performed. The patternings of the SrRuO$_3$ film 18 and the Pb(Zr, Ti)O$_3$ film 17 will be performed as follows.

Namely, an SiO$_2$ film (not shown) is deposited on the SrRuO$_3$ film 18 and then, patterned to form an SiO$_2$ film pattern. Thereafter, by making use of this SiO$_2$ film pattern as a mask, the SrRuO$_3$ film 18 is subjected to an etching treatment using an O$_3$ water to thereby form an upper electrode 20. Then, by means of a wet etching using an HCl solution or a dry etching using Ar or Cl$_2$ as an etching gas, the Pb(Zr, Ti)O$_3$ film 17 is subjected to a patterning process, thereby forming a ferroelectric film 19. Subsequently, the SiO$_2$ film pattern is removed to form a ferroelectric capacitor.

As described above, the upper electrode 20 and the ferroelectric film 19 are formed over a plurality of lower electrodes 16. However, even if the ferro-electric film and the upper electrode are individually formed in conformity with each of the lower electrodes as conventionally, since the upper electrode is connected with an earth and hence, since each of the upper electrode is electrically connected therewith, no problem will be raised even if the upper electrode is formed covering a plurality of lower electrodes as in the case of the capacitor to be obtained according to this example.

As described above, according to this example, since these ferroelectric film 19 and upper electrode 20 are formed continuously covering a plurality of lower electrodes 16, the patterning of these upper electrode 20 and ferroelectric film 19 can be performed at a region which has nothing to do with the property of capacitor, and hence, it is now possible to prevent the dielectric property of the ferroelectric film from being deteriorated at a region giving an influence to the capacitor.

EXAMPLE 2

The manufacturing steps of a semiconductor device according to a second example of this invention will be explained with reference to FIGS. 2A to 2J illustrating respectively a cross-sectional view of the semiconductor device.

First of all, as shown in FIG. 2A, a semiconductor element is formed in a semiconductor substrate (not shown), and then, an interlayer insulating film 31 is formed on the surface of the semiconductor substrate. Thereafter, via-holes are formed in the interlayer insulating film 31, and then, the via-holes are filled with a W-plug 32.

Figure 2B:
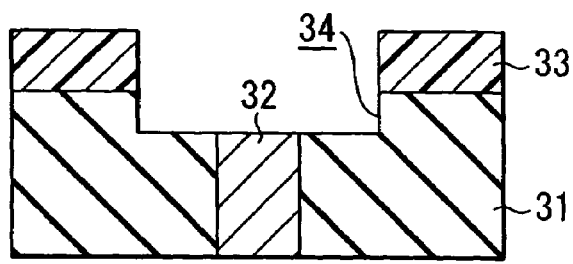

Then, as shown in FIG. 2B, a resist pattern 33 is formed on the interlayer insulating film 31 by means of lithography in such a manner as to expose the W-plug 32. Thereafter, by making use of this resist pattern 33 as a mask, the interlayer insulating film 31 and the W-plug 32 are etched to form recessed portions 34.

Figure 2C:
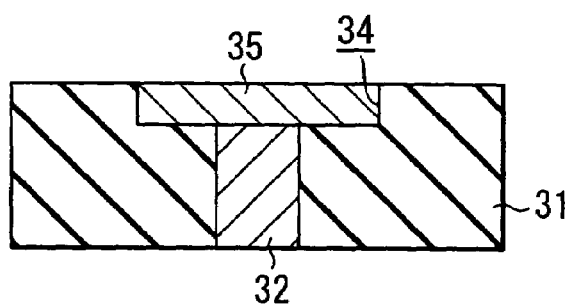

Next, as shown in FIG. 2C, after the resist pattern 33 is removed and the TiN film is deposited so as to fill the recessed portions 34 with the TiN film, the TiN film is polished by means of CMP with the interlayer insulating film 31 being employed as a stopper, thereby forming in the recessed portions 34 a TiN barrier layer 35 to be employed as a barrier layer of the W-plug 32. By the way, the cross-section of the TiN barrier layer 35 which is parallel with the main surface of the semiconductor substrate is made larger than the cross-section of the W-plug 32.

Figure 2D:
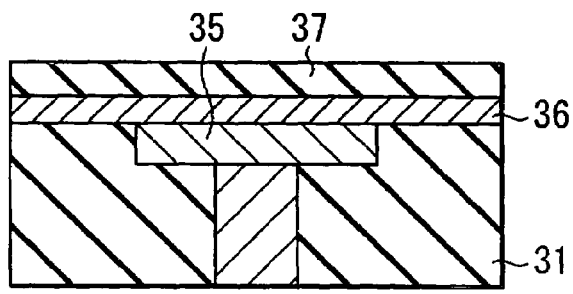
Figure 2E:
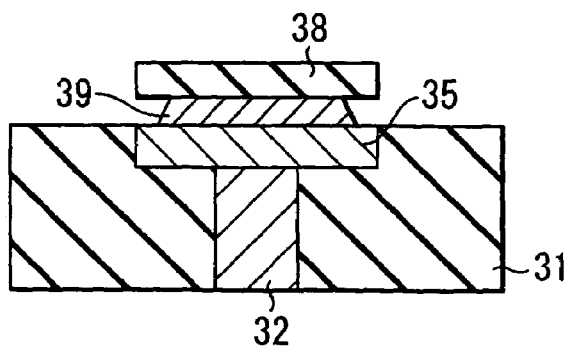

Thereafter, as shown in FIG. 2D, an SrRuO$_3$ film 36 to be employed as a lower electrode and having a thickness of 50 nm and an SiO$_2$ film (a dummy film) 37 having a thickness of 30 nm are successively deposited. Then, as shown in FIG. 2E, the SiO$_2$ film 37 is patterned by means of lithography and RIE to form an SiO$_2$ film pattern 38. The SrRuO$_3$ film 36 is then etched using an O$_3$ water with the SiO$_2$ film pattern 38 being employed as a mask to thereby form a lower electrode 39. In this wet etching, the lower electrode 39 is formed such that the top surface thereof is made smaller in area than that of the bottom surface thereof. However, depending on the etching conditions, the area of this top surface can be made identical with that of the bottom surface.

Figure 2F:
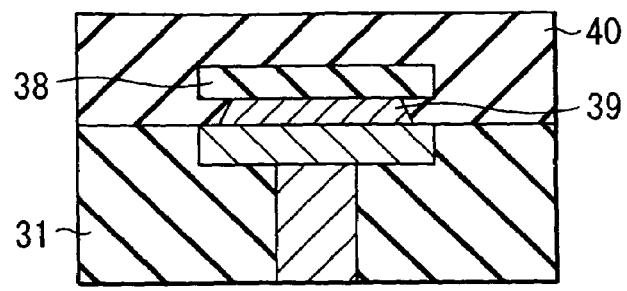
Figure 2G:
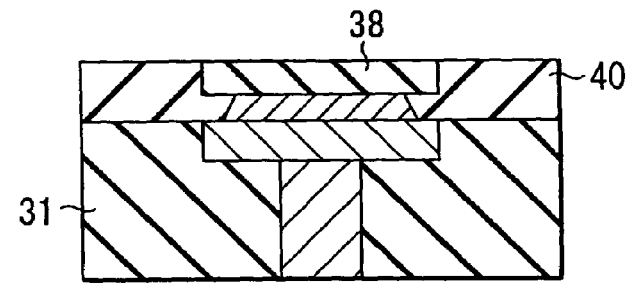
Figure 2H:
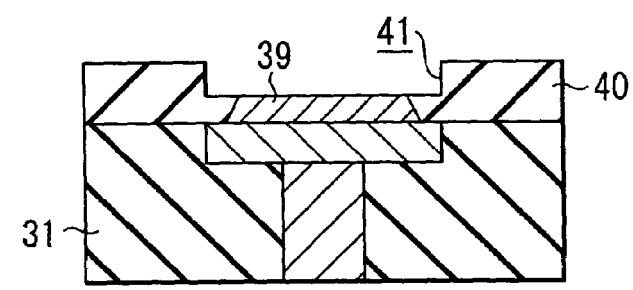

Then, as shown in FIG. 2F, an insulating film 40 consisting of a TiO$_2$ film or Si$_3$N$_4$ film is entirely deposited to cover the SiO$_2$ film pattern 38. Then, as shown in FIG. 2G, the insulating film 40 is polished by means of CMP with the SiO$_2$ film pattern 38 being employed as a stopper. Thereafter, as shown in FIG. 2H, the SiO$_2$ film 37 is selectively etched by making use of HF, thereby forming holes 41 exposing the lower electrode 36.

Figure 2I:
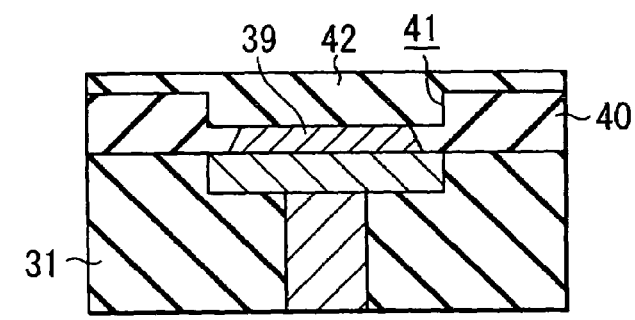
Figure 2J:
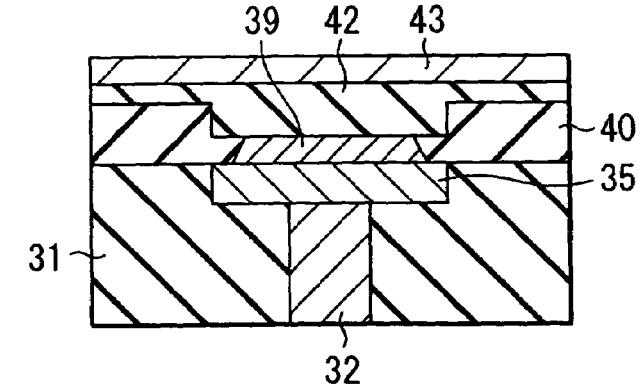

Then, as shown in FIG. 2I, a Pb(Zr, Ti)O$_3$ film 42 having a thickness of 100 nm and to be employed as a capacitor dielectric film is entirely deposited by means of sputtering method. As shown in FIG. 2J, an SrRuO$_3$ film 43 to be employed as an upper electrode is then deposited to a thickness of 100 nm.

Next, as in the case of the Example 1, the SrRuO$_3$ film 43 is patterned so as to cover a region including a plurality of the lower electrodes, thereby forming an upper electrode. The patterning of this SrRuO$_3$ film can be performed by a process wherein an SiO$_2$ film pattern is formed on the SrRuO$_3$ film 43 and then, by making use of this SiO$_2$ film pattern as a mask, the SrRuO$_3$ film 43 is subjected to an etching treatment using an O$_3$ water.

Then, by means of a wet etching using an HCl solution or a dry etching using a mixture of Ar and Cl$_2$ as an etching gas, the Pb(Zr, Ti)O$_3$ film 42 is subjected to a patterning process, thereby forming a capacitor dielectric film, thus obtaining a ferroelectric capacitor.

Since the Pb(Zr, Ti)O$_3$ film 42 is not separately patterned for each of a plurality of lower electrodes in the aforementioned manufacturing steps, the region of the capacitor dielectric film that corresponds to each of the lower electrode can be prevented from being exposed to a plasma atmosphere, and hence, the capacitor dielectric film can be prevented from being damaged and the dielectric property of capacitor can be inhibited from being deteriorated.

Further, the capacitor thus formed is constructed such that the lower electrode 39 is formed on the bottom surface of the hole 41 formed in the insulating film 40, and the Pb(Zr, Ti)O$_3$ film 42 is filled in the hole 41 and at the same time, formed on the insulating film 40. Therefore, the distance between the upper electrode and the lower electrode 39 can be enlarged, thereby making it possible to inhibit the generation of a leak current in the capacitor dielectric film and hence, to improve the dielectric property of the capacitor dielectric film.

Moreover, the cross-section of the TiN layer which is parallel with the main surface of the semiconductor substrate is made larger than the cross-section of the W-plug. Therefore, the oxygen that has been diffused into the TiN layer 35 through an interface between the lower electrode 39 and the TiN layer 35 can be inhibited from diffusing into the W-plug 32, thereby making it possible to prevent the W-plug 32 from being oxidized.

Figure 3:
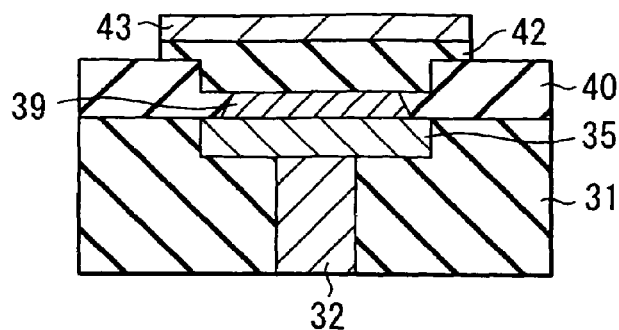
FIG. 3 is a cross-sectional view illustrating the construction of a semiconductor device according to a second example of this invention.

By the way, as shown in FIG. 3, the Pb(Zr, Ti)O$_3$ film 42 and the SrRuO$_3$ film 43 may be patterned for each of the lower electrode 39, thereby providing every one of the lower electrode 39 with each of the capacitor dielectric films and with each of the upper electrodes. Even if the Pb(Zr, Ti)O$_3$ film 42 and the SrRuO$_3$ film 43 are patterned in this manner, the Pb(Zr, Ti)O$_3$ film 42 of a region related to the capacitor can be prevented from being exposed to a plasma atmosphere, thereby making it possible to inhibit the dielectric property of the ferroelectric film from being deteriorated.

Another method of performing the patterning of the aforementioned SrRuO$_3$ film 36 other than the aforementioned method of using an O$_3$ water will be explained with reference to cross-sectional views shown in FIGS. 4A to 4F. By the way, the same portions as those of FIGS. 2A to 2J will be identified by the same reference numerals, thereby omitting the explanations thereof.

Figure 4A:
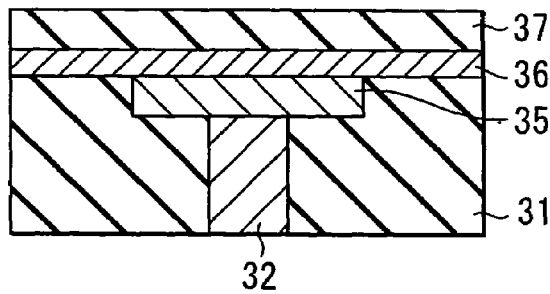
FIGS. 4A to 4F illustrate respectively a cross-sectional view illustrating the manufacturing steps of a semiconductor device according to a modification of the second example of this invention.
Figure 4B:
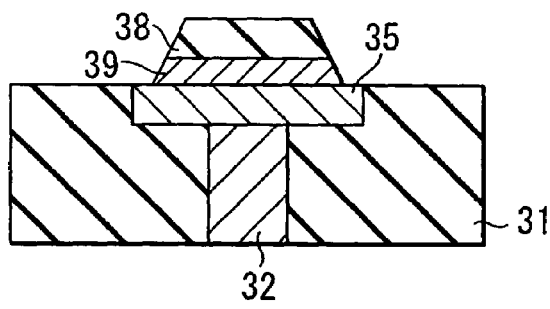

First of all, the structure as shown in FIG. 4A is formed by the same steps as illustrated in FIGS. 2A to 2D. Then, as shown in FIG. 4B, the SiO$_2$ film 37 is patterned by means of lithography and RIE to form an SiO$_2$ film pattern 38. The SrRuO$_3$ film 36 is then dry-etched using a reactive gas containing Ar and Cl$_2$ with the SiO$_2$ film pattern 38 being employed as a mask to thereby form an upper electrode 39.

Figure 4C:
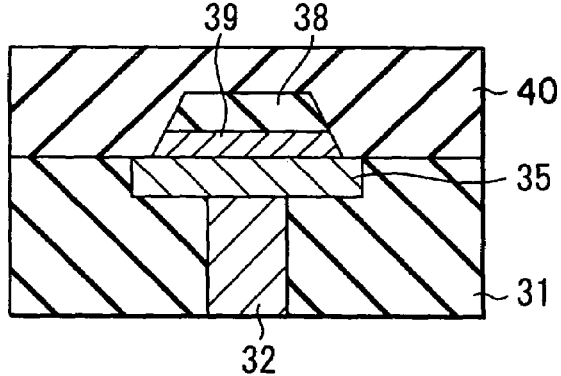
Figure 4D:
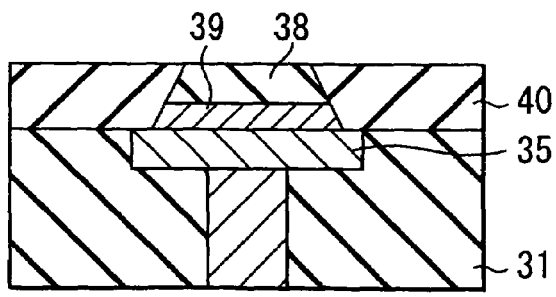
Figure 4E:
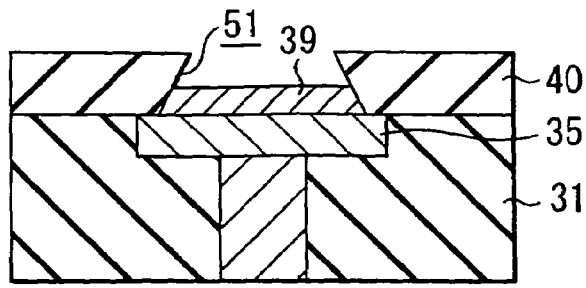
Figure 4F:
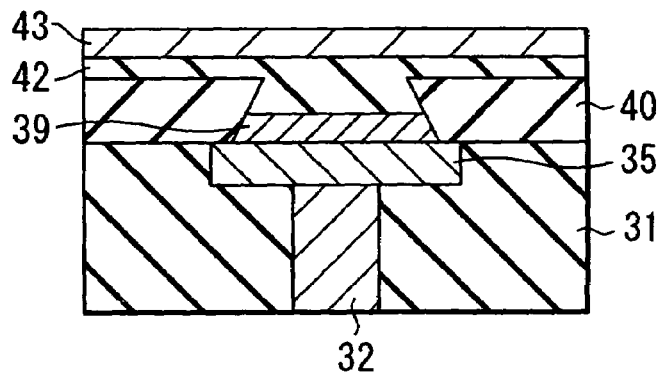

Then, as shown in FIG. 4C, an insulating film 40 is deposited, after which, as shown in FIG. 4D, the insulating film 40 is polished by means of CMP with the SiO$_2$ film pattern 38 being employed as a stopper. Thereafter, as shown in FIG. 4E, a hole 51 is formed, after which, as shown in FIG. 4F, a Pb(Zr, Ti)O$_3$ film 42 and an SrRuO$_3$ film 43 are successively deposited, and then, these films are patterned to form a capacitor.

EXAMPLE 3

In this example, a method of manufacturing a ferroelectric capacitor wherein a barrier metal and a capacitor dielectric film are formed by a procedure which is different from the aforementioned procedure will be explained with reference to FIGS. 5A to 5L. Namely, FIGS. 5A to 5L illustrate respectively a cross-sectional view illustrating the manufacturing steps of a semiconductor device according to a third example of this invention.

Figure 5A:
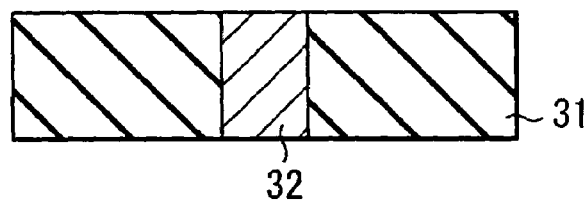
FIGS. 5A to 5L illustrate respectively a cross-sectional view illustrating the manufacturing steps of a semiconductor device according to a third example of this invention.

First of all, as shown in FIG. 5A, a semiconductor element is formed on a semiconductor substrate (not shown), and then, a first interlayer insulating film 31 is formed so as to cover a semiconductor element formed on the surface of the semiconductor substrate. Thereafter, via-holes are formed in the interlayer insulating film 31, and then, the via-holes are filled with a W-plug 32.

Figure 5B:
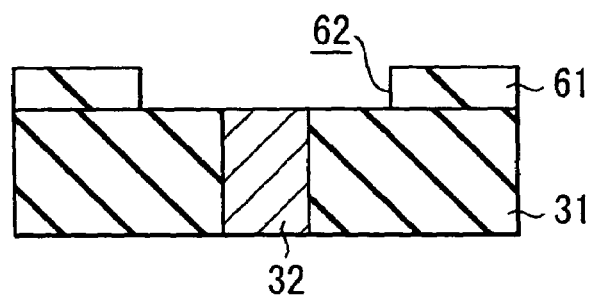
Figure 5C:
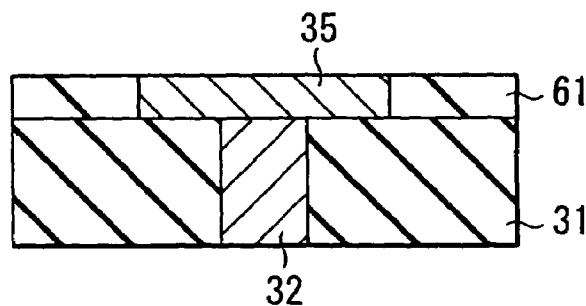

Then, as shown in FIG. 5B, a second interlayer insulating film 61 is formed, after which a hole 62 is formed in the second interlayer insulating film 61 so as to expose the W-plug 32. Thereafter, as shown in FIG. 5C, a TiN film is deposited all over the top surface, and then, the TiN film is polished by means of CMP with the second interlayer insulating film 61 being employed as a stopper, thereby forming in the hole 62 a TiN barrier layer 35.

Figure 5D:
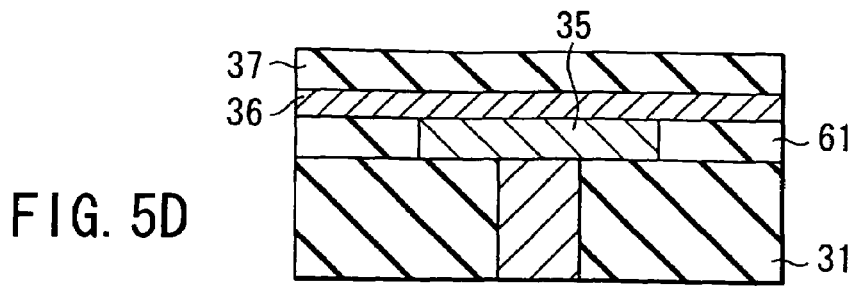
Figure 5E:
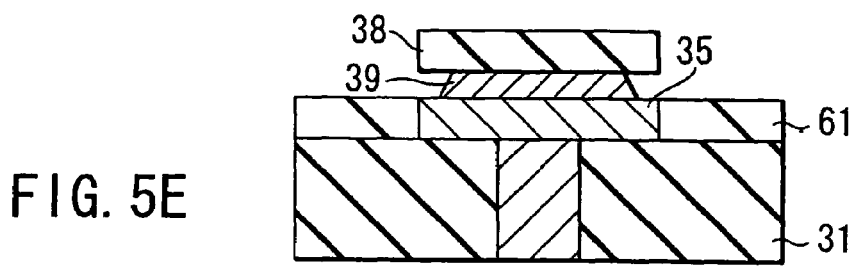
Figure 5F:
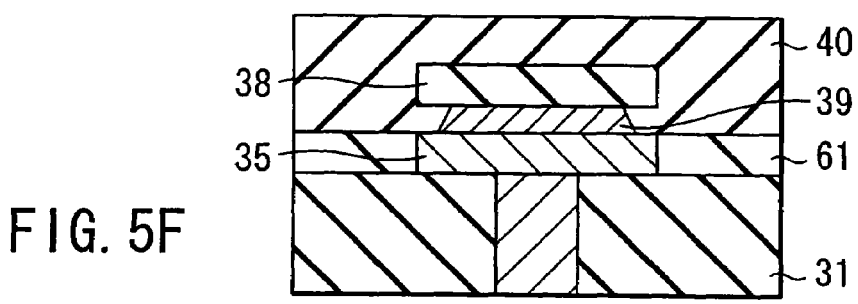
Figure 5G:
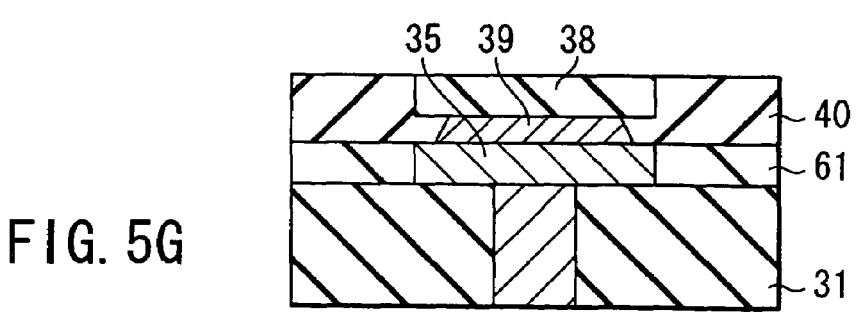
Figure 5H:
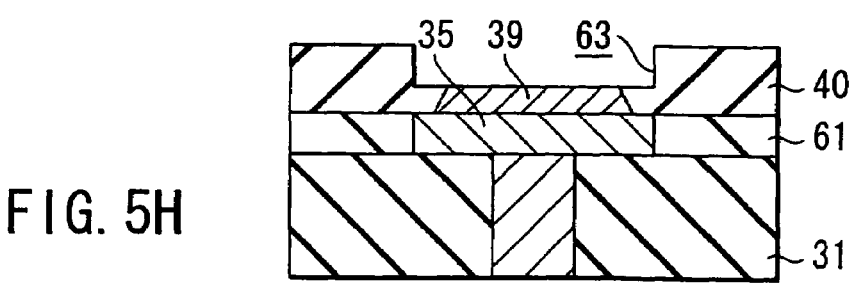

Thereafter, as shown in FIG. 5D, in the same manner as in Example 2, an SrRuO$_3$ film 36 and an SiO$_2$ film 37 are successively deposited. Then, the SiO$_2$ film 37 is patterned to form an SiO$_2$ film pattern 38. The SrRuO$_3$ film 36 is then etched using an O$_3$ water with the SiO$_2$ film pattern 38 being employed as a mask to thereby form a lower electrode 39 as shown in FIG. 5E. Then, as shown in FIG. 5F, an insulating film 40 is deposited, after which, as shown in FIG. 5G, the insulating film 40 is polished by means of CMP with the SiO$_2$ film pattern 38 being employed as a stopper. Thereafter, as shown in FIG. 5H, the SiO$_2$ film pattern 38 is removed, thereby forming holes 63 exposing the lower electrode 39.

Figure 5I:
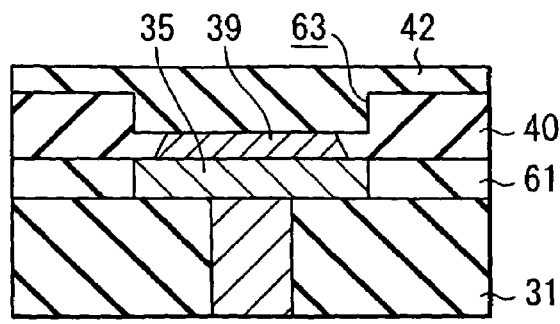
Figure 5J:
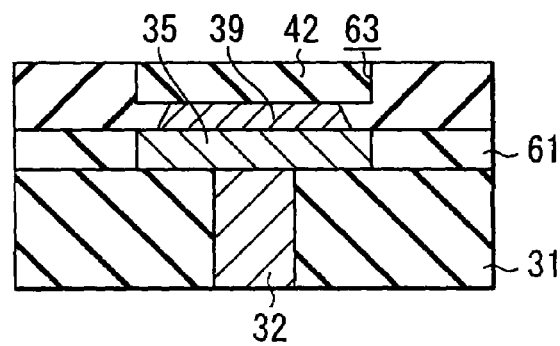

Then, as shown in FIG. 5I, a Pb(Zr, Ti)O$_3$ film 42 is deposited by means of sputtering method, which is followed by a heat treatment, thereby crystallizing the Pb(Zr, Ti)O$_3$ film. Then, as shown in FIG. 5J, the Pb(Zr, Ti)O$_3$ film 42 is polished by means of CMP with the insulating film 40 being employed as a stopper, thereby forming in the hole 63 the Pb(Zr, Ti)O$_3$ film 42 constituting a capacitor dielectric film.

Figure 5K:
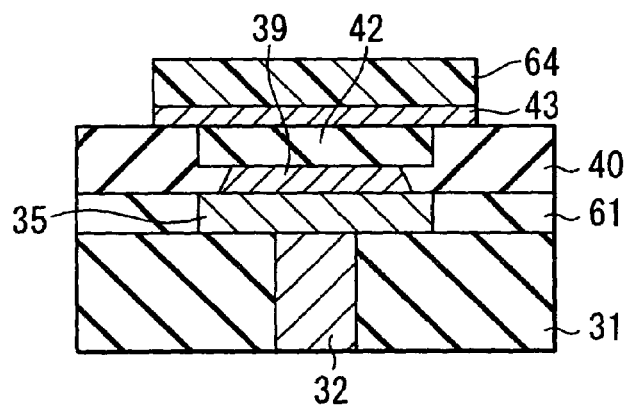

Next, as shown in FIG. 5K, an SrRuO$_3$ film to be employed as an upper electrode is deposited, after which a resist pattern 64 is formed in conformity with an upper electrode pattern. Then, by making use of the resist pattern 64 as a mask, the SrRuO$_3$ film is etched to form an upper electrode 43.

Figure 5L:
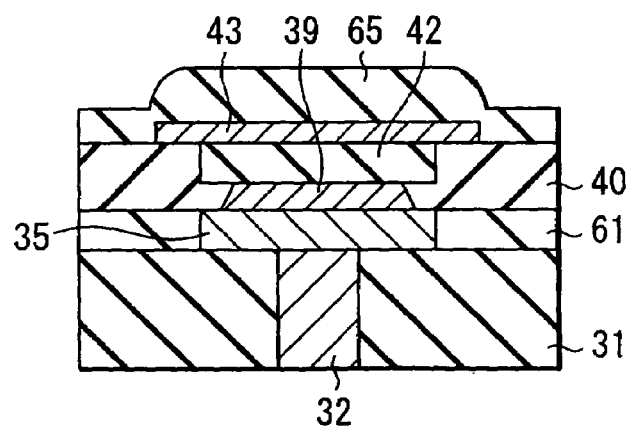

Then, as shown in FIG. 5L, after the resist pattern 64 is removed, a passivation film 65 is deposited to form a capacitor. Thereafter, openings exposing the upper electrode 43 are formed in the passivation film 65, and an electrode to be connected with the upper electrode through the opening is formed.

According to this example, a Pb(Zr, Ti)O$_3$ film 42 is deposited and then, this Pb(Zr, Ti)O$_3$ film 42 is polished by means of CMP so as to leave a portion of the Pb(Zr, Ti)O$_3$ film 42 in the hole 63, thereby forming a buried capacitor dielectric film in the hole 63. Thereafter, the deposition of an upper electrode material is performed, and then, a wide region including the remaining Pb(Zr, Ti)O$_3$ film 42 is patterned to form an upper electrode. Therefore, since this Pb(Zr, Ti)O$_3$ film 42 is not exposed to a plasma etching atmosphere at all, it is possible to inhibit the Pb(Zr, Ti)O$_3$ film from being deteriorated.

Further, since the sidewall of the lower electrode is recessed backward than the sidewall of the Pb(Zr, Ti)O$_3$ film due to the wet etching, and at the same time, since the Pb(Zr, Ti)O$_3$ film is buried in the hole, thus rendering the areas of the lower electrode, the Pb(Zr, Ti)O$_3$ film and the upper electrode to become larger in the mentioned order, it is possible to enlarge the distance between the upper electrode and the lower electrode, thus making it possible to inhibit the generation of leak current.

Next, another different method of performing the patterning of the SrRuO$_3$ film 36 other than the aforementioned method of using an O$_3$ water will be explained with reference to cross-sectional views shown in FIGS. 6A to 6G. By the way, the same portions as those of FIGS. 5A to 5L will be identified by the same reference numerals in FIGS. 6A to 6G, thereby omitting the explanations thereof.

Figure 6A:
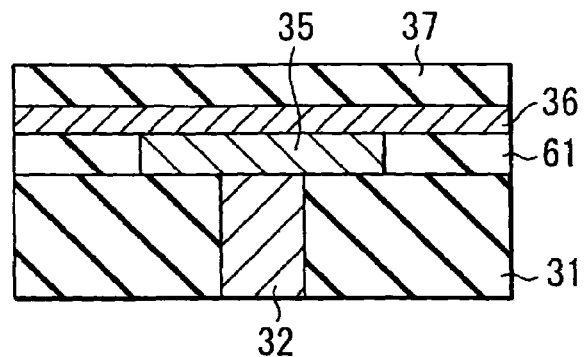
FIGS. 6A to 6G illustrate respectively a cross-sectional view illustrating the manufacturing steps of a semiconductor device according to a modification of the third example of this invention.
Figure 6B:
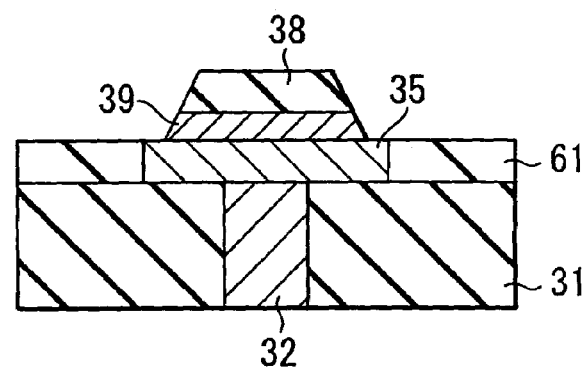

First of all, the structure as shown in FIG. 6A is formed by the same steps as illustrated in FIGS. 5A to 5D. Then, as shown in FIG. 6B, the SiO$_2$ film 37 is patterned by means of lithography and RIE to form an SiO$_2$ film pattern 38. The SrRuO$_3$ film 36 is then dry-etched using a reactive gas containing Ar and Cl$_2$ with the SiO$_2$ film pattern 38 being employed as a mask to thereby form a lower electrode 39.

Figure 6C:
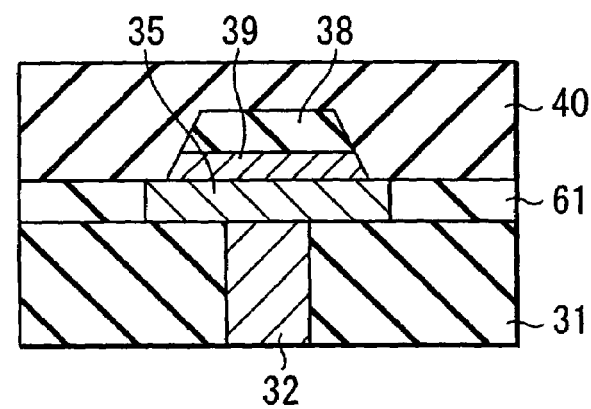
Figure 6D:
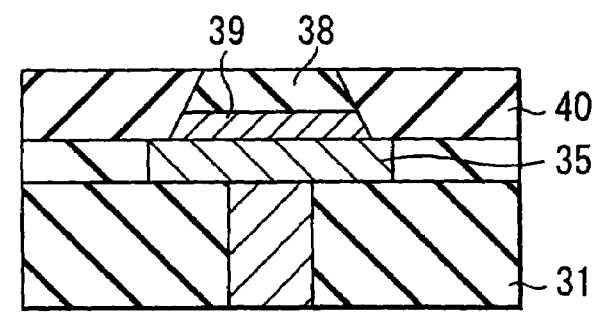
Figure 6E:
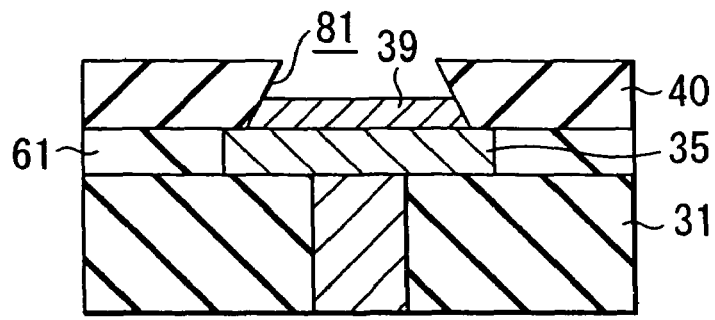
Figure 6F:
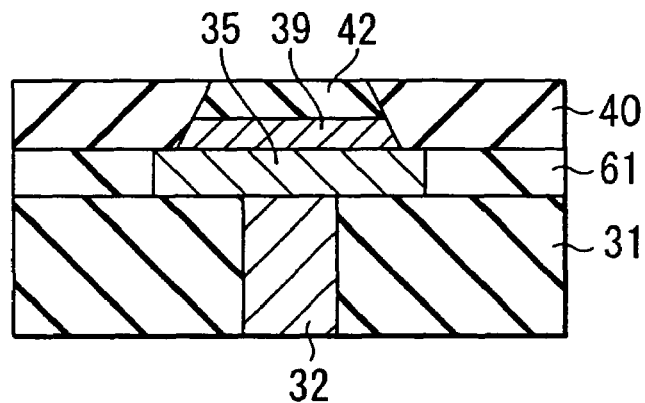
Figure 6G:
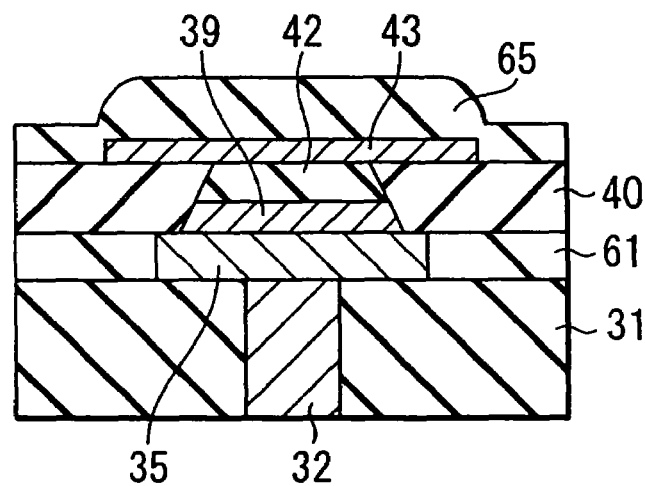

Then, as shown in FIG. 6C, an insulating film 40 is deposited, after which, as shown in FIG. 6D, the insulating film 40 is polished by means of CMP with the SiO$_2$ film pattern 38 being employed as a stopper. Thereafter, as shown in FIG. 6E, a hole 81 is formed, after which, as shown in FIG. 6F, a Pb(Zr, Ti)O₃ film 42 is filled in the hole 81, and then, an upper electrode 43 and a passivation film 65 are formed, thereby constructing a capacitor.

The capacitor constructed in these steps is featured in that since the lower electrode is formed by means of dry etching, the SiO₂ film constituting a dummy film is also etched, thereby making the area of the Pb(Zr, Ti)O₃ film smaller then that of the lower electrode. As a result, the Pb(Zr, Ti)O₃ film becomes smaller in area than that of the lower electrode and of the upper electrode. Therefore, it is now possible to enlarge the distance between the upper electrode and the lower electrode, thus making it possible to inhibit the generation of leak current.

EXAMPLE 4

The manufacturing steps of a semiconductor device according to a fourth example of this invention will be explained with reference to FIGS. 7A to 7H illustrating respectively a cross-sectional view of the semiconductor device.

Figure 7A:
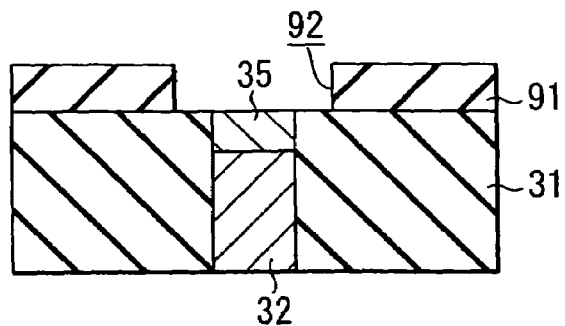
FIGS. 7A to 7H illustrate respectively a cross-sectional view illustrating the manufacturing steps of a semiconductor device according to a fourth example of this invention.

First of all, as shown in FIG. 7A, a semiconductor element is formed on a semiconductor substrate (not shown), and then, an interlayer insulating film 31 is formed to cover a semiconductor element formed on the surface of the semiconductor substrate. Thereafter, via-holes are formed in the interlayer insulating film 31, and then, the via-holes are filled with a W-plug 32. Then, the surface layer of the W-plug 32 is etched away to lower the level of the surface of the W-plug 32, after which a TiN barrier layer 35 is formed filling this recessed surface of the W-plug 32. Thereafter, a second insulating film 91 is entirely deposited, and a resist pattern (not shown) is formed on this second insulating film 91 in conformity with a capacitor. Then, by making use of this resist pattern as a mask, the second insulating film 91 is etched by means of anisotropic etching such as RIE, thereby forming, in this second insulating film 91, a hole 92 for forming a capacitor, and then, the resist pattern is removed.

Figure 7B:
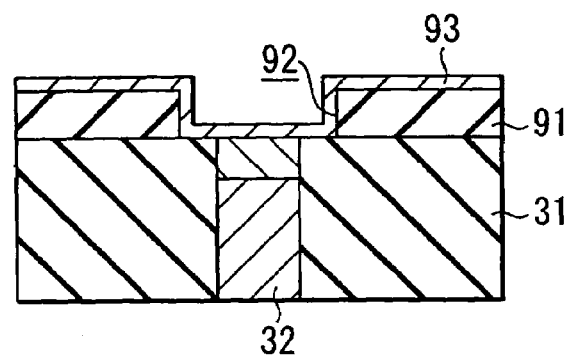
Figure 7C:
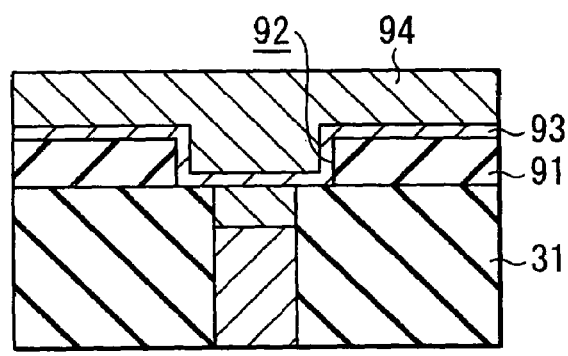
Figure 7D:
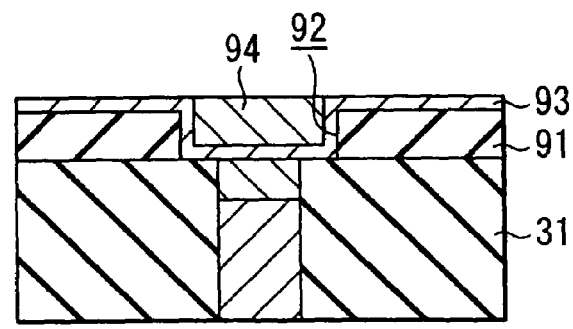

Then, as shown in FIG. 7B, an SrRuO₃ film 93 to be employed as a lower electrode of capacitor is entirely formed by means of sputtering method. Next, as shown in FIG. 7C, a dummy film 94 consisting of a silicon nitride film or metallic titanium is deposited so as to fill the hole 92. Then, as shown in FIG. 7D, the dummy film 94 is polished by means of CMP with the SrRuO₃ film 93 being employed as a stopper, thereby removing a portion of the dummy film 94 other than that filled in the hole 92.

Figure 7E:
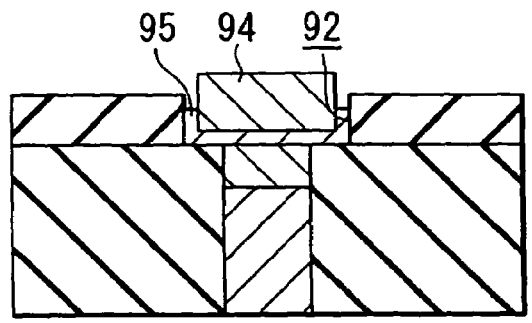

Thereafter, as shown in FIG. 7E, the SrRuO₃ film 93 thus exposed is wet-etched by making use of an O₃ water to leave the SrRuO₃ film 93 only on the bottom surface of the hole 92, thus forming a lower electrode 95. By the way, the SrRuO₃ film for constituting the lower electrode 95 is required to be left at least on the bottom surface of the hole 92, but the quantity of the SrRuO₃ film that may be left on the sidewall of the hole 92 may be variously altered.

Figure 7F:
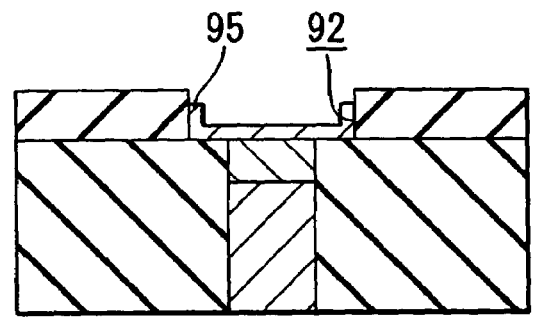

Then, as shown in FIG. 7F, the dummy film 94 is wet-etched so as to allow the lower electrode 95 to be exposed on the bottom surface of the hole 92. By the way, if a silicon nitride film is employed as this dummy film, it may be removed by making use of phosphoric acid, while if a metallic titanium film is employed as this dummy film, it may be removed by making use of hydrochloric acid.

Figure 7G:
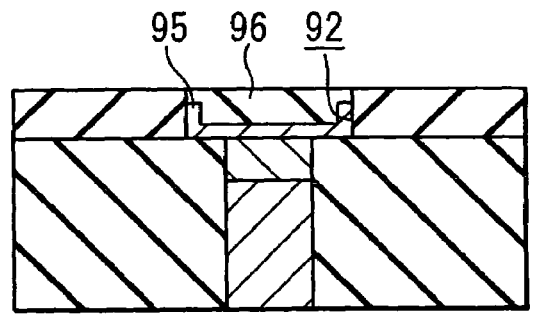

Then, as shown in FIG. 7G, after a Pb(Zr, Ti)O₃ film to be employed as a ferroelectric film is entirely deposited, the Pb(Zr, Ti)O₃ film is subjected to polishing such as CMP or etch-back treatment so as to leave the Pb(Zr, Ti)O₃ film as a ferroelectric film of capacitor in the hole 92. Then, as shown in FIG. 7H, after an SrRuO₃ film is deposited, the SrRuO₃ film is patterned by subjecting it to a wet etching treatment using an O₃ water, thereby forming an upper electrode 97, thus forming a capacitor.

By the way, as for this dummy film, it is possible to employ a metal which is soluble to an acid such as zirconium, cobalt and nickel, a metal which is soluble to an acid of high oxidizing power (for example, a mixture of aqueous solution of hydrogen peroxide and hydrochloric acid), a metal oxide such as titanium oxide, or a metal nitride. It is also possible to employ an amphoteric metal such as aluminum and copper as a dummy film, since they are soluble in a basic solution such as aqueous ammonia to be employed as an etchant.

Figure 7H:
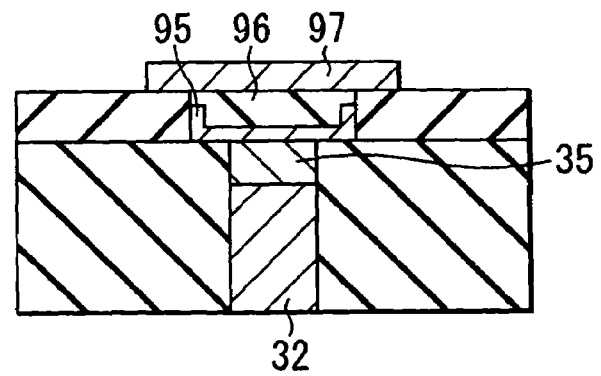

According to a semiconductor device which is provided with a capacitor constructed as shown in FIG. 7H, since the lower electrode and the ferroelectric film are buried in the hole, the dimension of the capacitor is determined by the dimension of the hole. As a result, it is advantageous in that the non-uniformity in dimension between neighboring cells can be minimized.

Further, when the lower electrode is formed not only on the bottom surface of the hole but also on the sidewall of the hole, the effective area of the lower electrode can be increased, thereby making it possible to enlarge the quantity of electric signal.

By the way, the insulating film may not be confined to a single layer but may be 2 or more-ply layer. Next, the manufacturing steps of a multi-layer interlayer insulating film will be explained with reference to cross-sectional views of FIGS. 8A to 8E.

Figure 8A:
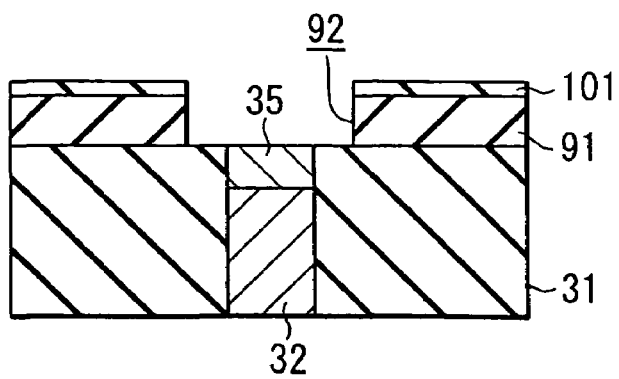
FIGS. 8A to 8E illustrate respectively a cross-sectional view illustrating the manufacturing steps of a semiconductor device according to a modification of the fourth example of this invention.

First of all, as shown in FIG. 8A, in the same manner as in Example 4, a W-plug 32 and a TiN barrier layer 35 are formed in the via-holes formed in an interlayer insulating film 31. Then, a first insulating film 91 and a second insulating film 101 are successively deposited, and a resist pattern (not shown) is then formed on this second insulating film 101 in conformity with a capacitor. Then, by making use of this resist pattern as a mask, the second insulating film 101 and first insulating film 91 are successively etched by means of anisotropic etching such as RIE, thereby forming a hole 92 for forming a capacitor, and then, the resist pattern is removed.

Figure 8B:
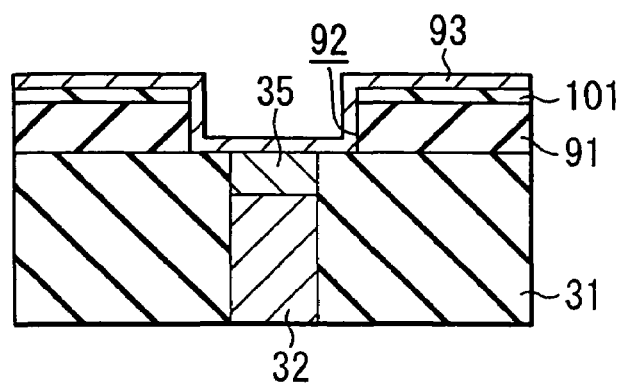
Figure 8C:
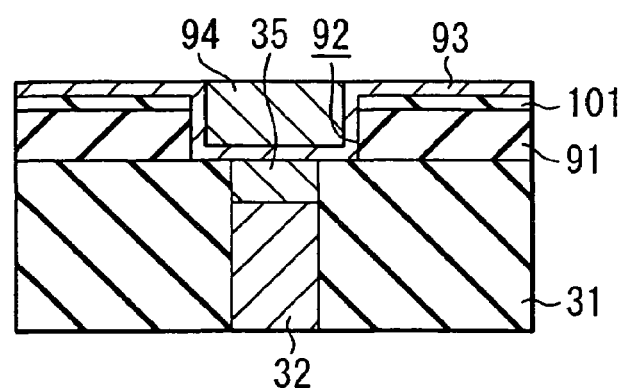
Figure 8D:
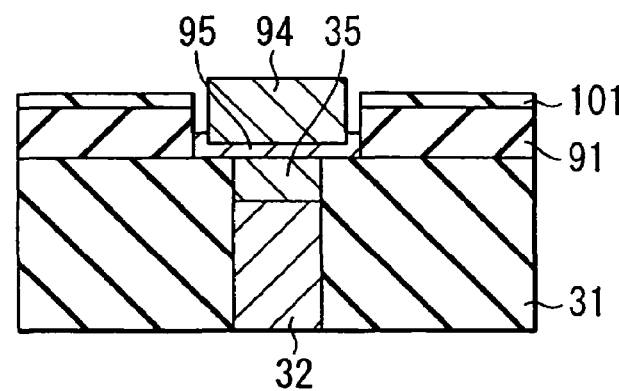

Then, in the same manner as illustrated in the manufacturing steps of the previous example and as shown in FIG. 8B, an SrRuO₃ film 93 to be employed as a lower electrode of capacitor is formed by means of sputtering method, and a dummy film 94 is deposited so as to fill the hole 92 (FIG. BC). Then, as shown in FIG. 8D, an exposed portion of the SrRuO₃ film 93 is wet-etched by making use of an O₃ water, thereby forming a lower electrode 95.

Figure 8E:
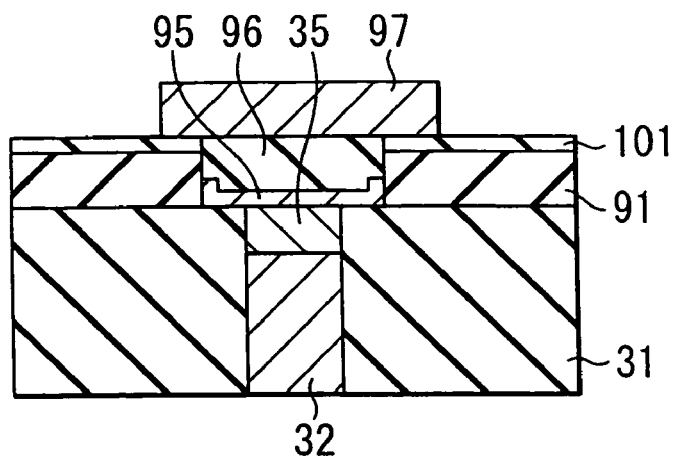

Thereafter, as shown in FIG. 8E, the dummy film 94 is wet-etched to allow the lower electrode 95 to be exposed at the bottom surface of the hole 92, and then, a Pb(Zr, Ti)O₃ film 96 to be employed as a ferroelectric film of capacitor is formed in the hole 92. After an SrRuO₃ film is deposited, a portion of the SrRuO₃ film is wet-etched by making use of an O₃ water to leave a portion of the SrRuO₃ film, thus forming an upper electrode 97 and accomplishing a capacitor.

Next, a method of manufacturing a semiconductor device provided with an upper electrode having a different structure from the aforementioned upper electrode of capacitor will be explained with reference to cross-sectional views shown in FIGS. 10A and 10B.

Figure 9A:
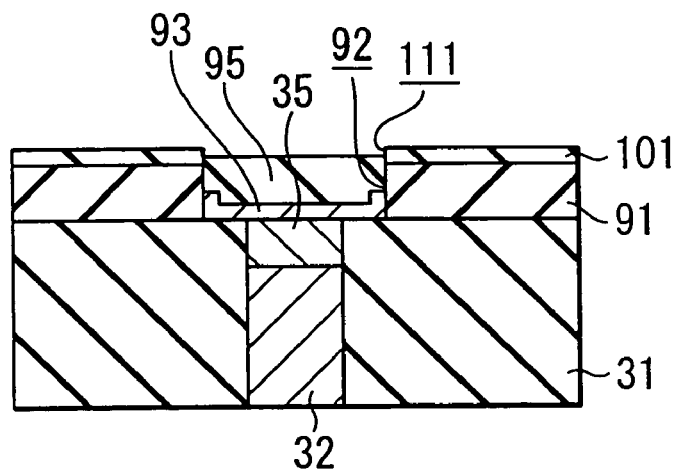
FIGS. 9A and 9B illustrate respectively a cross-sectional view illustrating the manufacturing steps of a semiconductor device according to another modification of the fourth example of this invention.

As shown in FIG. 9A, in the same manner as illustrated in the aforementioned manufacturing steps, a Pb(Zr, Ti)O₃ film 96 is deposited and filled in the hole 92, and then, the Pb(Zr, Ti)O₃ film 96 is subjected to an etch-back treatment using a hydrochloric acid/hydrofluoric acid mixture. On this occasion, the height of the top surface of the Pb(Zr, Ti)O₃ film 96 is made lower than the top surface of the second insulating film 101, thereby forming a hole 111.

Figure 9B:
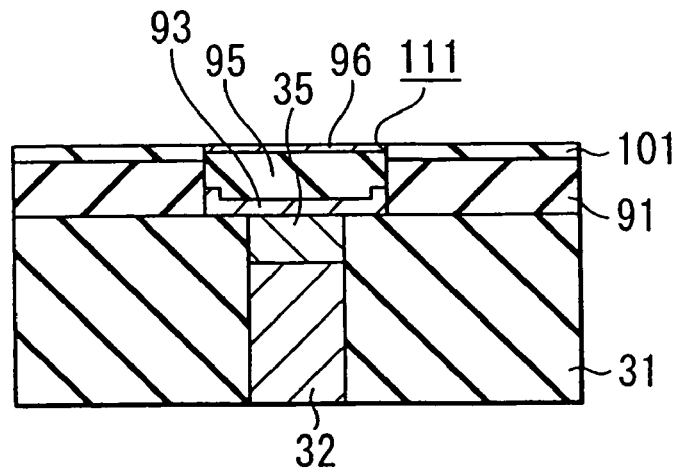

Then, as shown in FIG. 9B, after an SrRuO$_3$ film is deposited, a portion of the SrRuO$_3$ film is polished by means of CMP with an insulating film being employed as a mask, thereby forming an upper electrode 97 which is filled in the hole.

When the upper electrode 97 is formed in this manner, a step of patterning for working the upper electrode can be dispensed with. Further, since the upper electrode thus formed is not protruded out of the insulating film, the area of the capacitor can be minimized.

It should be appreciated that this invention is not confined to the aforementioned examples. For example, although a Pb(Zr, Ti)O$_3$ film is employed as a ferroelectric film, other kinds of ferroelectric material can be employed. Namely, this invention can be variously modified within the spirit of this invention.

As explained above, since these ferroelectric film and upper electrode are formed continuously covering a plurality of lower electrodes, the patterning of these upper electrode and ferroelectric film can be performed at a region which has nothing to do with the property of capacitor, thereby making it possible to prevent the dielectric property of the ferroelectric film from being deteriorated at a region giving an influence to the capacitor.

According to the semiconductor device of the second embodiment of this invention, the ferroelectric film can be formed to have an area which is smaller than that of the lower electrode and of the upper electrode.

Furthermore, since the formation and patterning of the upper electrode are performed subsequent to the burying step of the ferroelectric film in the hole, the ferroelectric film can be prevented from being exposed to a plasma atmosphere, and hence, the ferroelectric film can be prevented from being damaged, thereby making it possible to prevent the properties of the ferroelectric film from being badly affected.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, which comprises:

forming a first insulating film on a semiconductor substrate having a semiconductor element formed therein;

burying a first conductive layer in the first insulating film, said first conductive layer being electrically connected with the semiconductor element, and said first insulating film and the first conductive layer having the same surface level and forming a flat surface structure;

forming a second conductive layer and a dummy film formed of a material selected from the group consisting of a metal, an oxide, and nitride, successively on said first insulating film, said second conductive layer being in contact with the first insulating film and the first conductive layer;

forming a dummy film pattern by patterning said dummy film;

forming a lower electrode by etching said second conductive layer with only said dummy film pattern being employed as an etching mask;

forming a second insulating film on said first insulating film and on said dummy film pattern;

removing a surface region of said second insulating film by means of chemical mechanical polishing to expose a surface of said dummy film pattern;

forming a hole having a bottom exposing said lower electrode by removing said dummy film pattern;

forming a ferroelectric film on the second insulating film and in the hole;

removing a surface region of said ferroelectric film by means of chemical mechanical polishing to expose a surface of said second insulating film, said hole being filled with the ferroelectric film having substantially the same thickness as the dummy film pattern; and forming an upper electrode on said ferroelectric film thereby forming a capacitor.

2. The method according to claim 1, wherein said lower electrode is electrically connected with a plug buried in said first insulating film.

3. The method according to claim 1, wherein said dummy film is formed of a material which can be selectively etched away by an etching method exhibiting a selectivity to said second insulating film.

4. The method according to claim 1, wherein after removing a surface region of said ferroelectric film, said ferroelectric film and said second insulating film have the same surface level.

5. The method according to claim 1, wherein the upper electrode is formed of SrRuO$_3$.

* * * * *